(12) United States Patent
Natarajan et al.

(10) Patent No.: US 6,245,171 B1
(45) Date of Patent: *Jun. 12, 2001

(54) MULTI-THICKNESS, MULTI-LAYER GREEN SHEET LAMINATION AND METHOD THEREOF

(75) Inventors: Govindarajan Natarajan, Pleasant Valley; Krishna G. Sachdev, Hopewell Junction; Abubaker S. Shagan, P'keepsie, all of NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/198,819

(22) Filed: Nov. 23, 1998

(51) Int. Cl.[7] .................................................. C03B 29/00
(52) U.S. Cl. ..................... 156/89.11; 156/89.12; 156/289
(58) Field of Search ................ 156/89.11, 89.12, 156/89.23, 289, 308.2, 308.6

(56) References Cited

U.S. PATENT DOCUMENTS

| | | | |
|---|---|---|---|
| 4,920,640 | * 5/1990 | Enloe et al. | 29/852 |
| 5,254,191 | 10/1993 | Mikeska et al. . | |
| 5,468,315 | * 11/1995 | Okada et al. | 156/64 |
| 5,474,741 | 12/1995 | Mikeska et al. . | |
| 5,601,672 | * 2/1997 | Casey et al. | 156/89 |
| 5,976,286 | * 11/1999 | Natarajan | 156/60 |

* cited by examiner

Primary Examiner—Michael W. Ball
Assistant Examiner—John T. Haran
(74) Attorney, Agent, or Firm—Margaret A. Pepper; Aziz M. Ahsan

(57) ABSTRACT

The present invention relates generally to using at least one green sheet that is originally very thin with the help of at least one thicker green sheet. An adhesion barrier to build multi-layer ceramic laminates and process thereof is also disclosed. Basically, the present invention relates to a structure and method for forming laminated structures and more particularly to a structure and method for fabricating multi-density, multi-layer ceramic products using at least one very thin green sheet and/or at least one green sheet with very dense electrically conductive patterns on top of at least one thicker green sheet.

23 Claims, 2 Drawing Sheets

MULTI-THICKNESS, MULTI-LAYER GREEN SHEET LAMINATION AND METHOD THEREOF

FIELD OF THE INVENTION

The present invention relates generally to using at least one green sheet that is originally very thin with the help of at least one thicker green sheet. An adhesion barrier to build multi-layer ceramic laminates and process thereof is also disclosed. Basically, the present invention relates to a structure and method for forming laminated structures and more particularly to a structure and method for fabricating multi-density, multi-layer ceramic products using at least one very thin green sheet and/or at least one green sheet with very dense electrically conductive patterns on top of at least one thicker green sheet.

BACKGROUND OF THE INVENTION

Multi-layer ceramic (MLC) structures are used in the production of electronic substrates and devices. The MLCs can have various layering configurations. For example, a MLC circuit substrate may comprise patterned metal layers which act as electrical conductors sandwiched in between ceramic layers which act as a dielectric medium. For the purposes of interlayer interconnections, most of the ceramic layers have tiny holes or via holes. Prior to lamination, the via holes are filled with an electrically conductive paste, such as, a metallic paste, and sintered to form vias which provide the electrical connection between the layers. In addition, the MLC substrates may have termination pads for attaching semiconductor chips, connector leads, capacitors, resistors, to name a few.

Generally, ceramic structures are formed from ceramic green sheets which are prepared from a slurry of ceramic particulate, thermoplastic polymer binders, plasticizers, and solvents. This composition is spread or cast into ceramic sheets or slips from which the solvents are subsequently volatilized to provide coherent and self-supporting flexible green sheets. After punching, metal paste screening, stacking and laminating, the green sheets are fired or sintered at temperatures sufficient to burn-off or remove the unwanted polymeric binder resin and sinter the ceramic particulate together into a densified ceramic substrate. The present invention is directed to the screening, stacking and lamination steps of this process.

In the MLC packaging industry it is very common to use green sheets of various thicknesses. The thicknesses can typically vary from 6 mils to 30 mils and in general the art of punching and metallizing these layers are well known. Green sheet thicknesses below 6 mils, in general, are very scarcely used. This is due to a variety of reasons, such as, for example, handling, screening and stacking of green sheets thinner than 6 mils pose tremendous challenges. In fact the use of one to two mils thick ceramic green sheets, which are punched and screened, using traditional MLC technology does not exist.

Also, in the MLC packaging industry it is very common to use capacitor layers. The capacitance necessary in a package depends on the design and such capacitance is obtained by choosing proper dielectric layer thickness and metal area within a layer. The industry is always striving for higher capacitance and since the metal area is maxing out for a given substrate size it is necessary to use thinner dielectric layers between electrodes to obtain the required capacitance. For example, as a rule of thumb one could double the capacitance for a given dielectric system and electrode metal area by decreasing the dielectric layer thickness by half. Additionally the number of layers needed for capacitance in a package as well has been reduced by about 50 percent. The reduction in the number of layers is desirable, as it reduces the cost and the process of making the substrate.

U.S. Pat. No. 5,254,191 and No. 5,474,741 (Mikeska) teaches the use of flexible constraining layers to reduce X-Y shrinkage during firing of green ceramic bodies. But these flexible constraining layers, among other things, do not act as an adhesion barrier during lamination.

However, the present invention forms laminated multi-density, multi-layer ceramic structures using at least one very thin green sheet and/or at least one green sheet with very dense electrically conductive patterns on top of at least one thicker green sheet. An adhesion barrier that is useful during the lamination process is also utilized to build these multi-density, multi-layer ceramic laminates.

PURPOSES AND SUMMARY OF THE INVENTION

Bearing in mind the problems and deficiencies of the prior art it is therefore one purpose of the present invention to provide a novel method and structure for producing metallized thin green sheets, including sub-structures in multi-layer ceramic packages with novel adhesion barrier therein.

Another purpose of this invention is to have a structure and a method that will provide a semiconductor substrate with at least one capacitor layer or with at least one fine line patterned conductive metal layer.

Yet another purpose of this invention is to provide a structure and a method that will ensure multiple thin layers in a multilayer ceramic package.

Still another purpose of the present invention is to provide a structure and method that will ensure higher capacitance in a multi-layer ceramic package.

Yet another purpose of the present invention is to have a structure and a method for fine line pattern using thin green sheets in multi-layer ceramic packages.

Still yet another purpose of the present invention is to provide a structure and a method for metallizing a thin green sheet without any detrimental distortion.

Still another purpose of the present invention is to have a structure and a method that will ensure handling of thin green sheets for multi-layer ceramic packages.

It is another purpose of the invention to have a structure and a method that produces a multilayer ceramic package that is predictable and repeatable.

Another purpose of the present invention is to laminate several stacked green sheets with novel adhesion barrier to produce sub-structures.

Yet another purpose of the present invention is to use at least one adhesion barrier in lamination of multilayer ceramic packages.

Other purposes, objects and advantages of the present invention will in part be obvious and will in part be apparent from the specification.

Therefore, in one aspect this invention comprises a method of fabricating at least one multi-density semiconductor substrate comprising the steps of:

(a) forming at least one electrically conductive feature on at least one thick green sheet;

(b) providing at least one thin green sheet with at least one via hole;

(c) aligning and placing said thin green sheet over said thick green sheet, such that at least a portion of said electrically conductive feature is in contact with at least a portion of said via hole;

(d) dusting lamination surfaces with at least one inorganic adhesion barrier powder;

(e) tacking and bonding said at least one thin green sheet to said at least one thick green sheet, and thereby fabricating said multi-density semiconductor substrate.

In another aspect this invention comprises a multi-density substrate comprising at least one thin green sheet with at least one via hole in intimate contact with at least one thick green sheet, wherein at least one electrically conductive feature is sandwiched between said thin green sheet and said thick green sheet, and wherein at least a portion of said via hole is in contact with at least a portion of said at least one electrically conductive feature, and thereby forming said multi-density substrate.

In yet another aspect this invention comprises a multi-density substrate comprising at least one thin green sheet with at least one via hole in intimate contact with at least one thick green sheet having at least one electrically conductive material in secure contact with said thin green sheet, and wherein at least a portion of said via hole is in contact with at least a portion of said electrically conductive material, and wherein at least a portion of at least one surface of said thick and/or thin green sheet has at least one layer of at least one adhesive barrier material, and thereby forming said multi-density substrate.

BRIEF DESCRIPTION OF THE DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows taken in conjunction with the accompanying drawings in which:

DETAILED DESCRIPTION OF THE INVENTION

Figure 1:
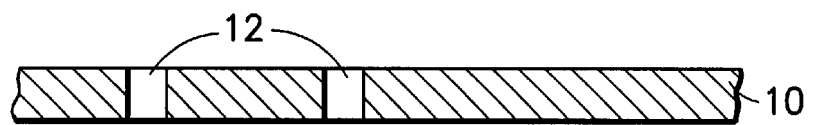
FIG. 1, illustrates a thin green sheet with an unfilled via hole.

The structure and method of the present invention enables the handling, screening, stacking and lamination of thin ceramic layers. These thin ceramic layers are used in the semiconductor industry for a variety of purposes, such as, for example, for a capacitor structure, or for a fine line pattern structure in MLC packages, to name a few.

As stated earlier, that the structure and method of the present invention enables the screening, stacking and handling of very thin green sheets and/or green sheets with very dense metallized patterns in the manufacture of multi-layer ceramic packages. With the preferred embodiment, thin punched green sheets were tacked and bonded to thick punched and screened green sheets to form a sub-structure which yields excellent stability in screening and enables excellent handling and alignment in stacking. The green sheet sub-structure may have electrically conductive features within them, such as, a via, or over them, such as, a line, cap, to name a few.

The tacking and bonding of thin sheets onto a thicker sheet involves preferably heat and pressure. In such instances it is necessary to eliminate paste pull and ceramic damage by using a non-sticking solid polymeric material as the adhesion barrier between the green sheets and the metal surfaces that transfer heat and pressure on to the green sheet stack. The polymeric non-sticking material as is or with surface coating in general is very expensive and could be cost-prohibitive in several manufacturing applications. In order to make certain product design and associated processes viable in manufacturing, the present invention uses one of several very fine inorganic powders, preferably in submicron size, such as magnesium silicate or alumino-magnesium-silicate ceramics or oxides of aluminum-magnesium-silicon or alumina, to name a few, as an adhesion barrier. It is preferred to dust the heated metal surfaces of the pressure applying devices that contact the green sheet stack with the inorganic powders as the adhesion barrier. It is also preferable that the surfaces of the metal plate be coated with electroless nickel or titanium nitride, to name a few, to improve the surface characteristics of the lamination plates.

The invention also provides for a thicker ceramic green sheet that is punched and screened to have at least one adhesive barrier material on at least one side, and the thicker green sheet be used as a base or a permanent support for a thinner ceramic punched green sheet layer which has at least one adhesive barrier material on at least on one surface.

Additionally the invention also provides for the thicker permanent ceramic base to act as a shrinkage and distortion restrainer when the thinner ceramic sheet is screened with conductive paste and dried.

Furthermore, the securing of the thinner green sheet on the thicker green sheet base has totally eliminated handling problems, such as, for example, in stacking.

This invention also eliminates is the use of a polymeric adhesion barrier in lamination by the introduction of the novel and inexpensive inorganic adhesion barrier.

FIG. 1, illustrates at least one thin green sheet 10, such as, a thin ceramic green sheet 10, with at least a via hole 12. The thinness of a green sheet is a relative measure, and it means as thin as one could preform, to as thin as one could handle through via forming technique, like mechanical punching or laser hole formation or very intensive chemical technique such as photo-processing. The via hole 12, is a punched but not a filled via hole 12.

The term thin sheet or layer as used herein means that the thickness of the sheet can be anywhere from about 0.5 mil to about 6.0 mils. Furthermore, production level screening and stacking of these types of thin sheets is not possible with the current technology as the thin sheets tend to shrink a lot and they also tend to distort during the process.

Figure 2:
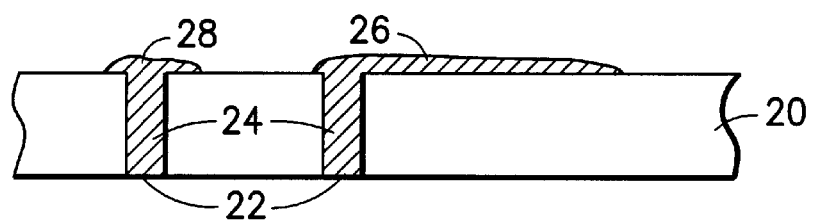
FIG. 2, illustrates a thick green sheet which has been punched and metallized.

FIG. 2, shows at least one thicker green sheet 20, such as, a thicker ceramic green sheet 20, with at least one punched via hole 22, that has been metallized with at least one electrically conductive metallic material 24. Punching of via holes 22, in the ceramic green sheets 20, and filling the via holes 22, with at least one electrically conductive metallic or composite material 24, is well known in the art. Typically, an electrically conductive paste 24, is screened into the via hole 22, and the green sheet 20, is metallized with an appropriate pattern 26 and/or 28. The patterns 26 and 28, could be an electrically conductive line or cap, to name a few.

Thickness of the green sheet 20, is again a relative measure, and it means as thick as the design warrants, to and as thick as one could cast and personalize. Because it is a thicker sheet, it is possible to punch and screen these layers with conventional technique without any detrimental pattern distortion and radial error. In general a radial error greater than about 1.2 mils is considered not good.

Figure 3:
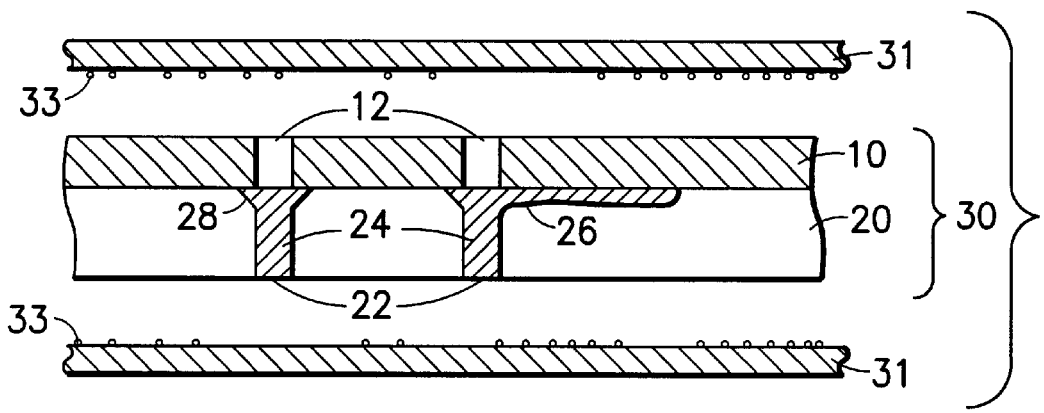
FIG. 3, illustrates the thin green sheet of FIG. 1, secured to the thick green sheet of FIG. 2, with the adhesion barrier on the lamination plates.

FIG. 3, illustrates a preferred embodiment of this invention where the thin green sheet 10, of FIG. 1, is secured to the thicker green sheet 20, of FIG. 2. The punched thin green sheet 10, can be secured to the punched and screened thicker ceramic green sheet 20, by bonding or tacking using a lamination process with plates 31, having at least one adhesion barrier 33. It should be appreciated that the inorganic adhesion barrier dust 33, to some extent is transferred onto the surfaces of the substructures. As stated earlier, that the via hole 12, is a punched but not a filled via hole 12, in the tacked or bonded thin ceramic green sheet 10. The screened features 26 and 28, in the thicker green sheet 20, can be above the surface of the sheet 20, as shown in FIG. 2, or partially or fully imbedded in the green sheet 20, as shown in FIG. 3.

It is preferred that the average particle size for the adhesion barrier material 33, is less than about 5 microns, and preferably less than about 1 micron. The average particle size as used herein means the longest dimension for the given particle, as these particles can be of any shape and/or form. And, wherein the average thickness for the adhesion barrier layer 33, that is on the plate 31, is less than about 20 mils, and preferably less than about 5 mils.

The adhesion barrier dust particles 33, are preferably chosen of the same material as at least one of the green sheet ceramic materials, and therefore it is not necessary to remove it after the substructure formation or lamination, or prior to or after sintering.

The bonding and/or tacking of the thinner green sheet 10, to the thicker green sheet 20, can be achieved by a variety of processes, such as, for example, by a standard lamination process. It is very important that the bonding and/or tacking process used should not distort the features 26 and 28, located on the thicker sheet 20, and that the green sheets 10 and/or 20, do not stick to the plates 31. For the green sheets 10 and 20, that were used, a lamination pressures of less than 800 psi, and a temperature of less than 90° C., was found suitable for the bonding and/or tacking operation. It is preferred that the adhesion barriers 33, that is used should be suitable for providing a clean separation of the plates 31, from the green sheets 10 and/or 20.

After the bonding/tacking process a multi-media or multi-density sub-structure 30, was obtained, which comprised of at least one thin ceramic layer 10, and at least one thick ceramic layer 20. The multi-density structure 30, looks and behaves as a single green sheet layer 30. The sub-structure 30, has via hole 12, which starts from one surface and does not go all the way through, i.e., the via hole 12, which started as a through-hole 12, but now is a blind via hole 12. Furthermore, it is preferred that the metallized vias 24, be appropriately aligned with the screened vias 22, and non-screened via hole 12, and thus will provide a top to bottom alignment. These unique features of this invention enable the handling of the thin ceramic sheet 10, as a sub-structure 30. Furthermore, the sub-structure 30, has no other material set, other than the green sheets 10 and 20, and the screened paste 24, to form features 26 and 28, which requires least processing cost and provides best yields. As stated earlier, that the inorganic adhesion barrier dust 33, to some extent is transferred onto the surfaces of the substructures.

Figure 4:
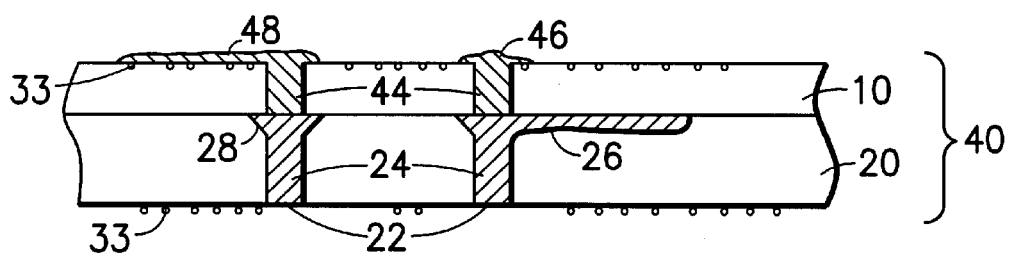
FIG. 4, illustrates the metallization of the structure shown in FIG. 3, with the adhesion barrier of the surfaces of the green sheets that came in contact with the lamination plates.

FIG. 4, illustrates the metallization of the screened sub-structure 30, shown in FIG. 3, to form a sub-structure 40. Here the sub-structure 30, was screened with an electrically conductive metal or composite paste 44, to form features 46 and 48, on the thin ceramic sheet 10, to form an intermediate or final structure 40. Feature 46, could be a via 46, formed in the via hole 12, while the feature 48, could be a pattern, such as, a cap or line 48. The structure 40, of this invention shows features 46 and 48, in the thin green sheet layer 10, that makes electrical connection to via 24, and patterns 26 and 28, on the thick green sheet 20.

Figure 5:
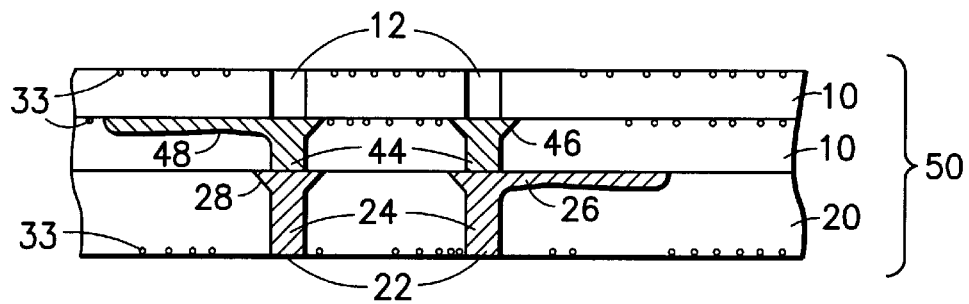
FIG. 5, illustrates another embodiment of this invention where at least one more layer of a thin green sheet, as shown in FIG. 1, has been secured to the structure as shown in FIG. 4.

FIG. 5, illustrates another embodiment of this invention where the structure 40, as shown in FIG. 4, has been secured with another layer of a thin green sheet 10, as shown in FIG. 1, to form a structure 50. Basically, the screened structure 40, that was obtained as described from FIG. 1 through 4, was secured, such as, by tacking/bonding and by using the adhesion barrier material, to a punched thin ceramic layer 10, as illustrated in FIG. 1.

Figure 6:
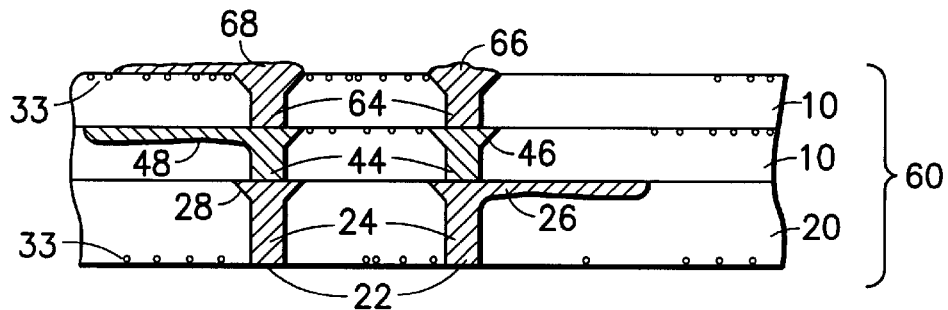
FIG. 6, illustrates the metallization of the thin green sheet of the structure shown in FIG. 5.

FIG. 6, illustrates the metallization of the structure 50, as shown in FIG. 5, to form a structure 60. The via hole 12, is filled with at least one electrically conductive material 64, such that, the material 64, is in direct contact with the via material 44, of the earlier thin ceramic layer 10. And that metallization 66 and 68, if needed, is in direct contact with the via 64, of the new thin green sheet 10. This multi-density structure 60, can now be further processed as a ceramic material 60.

Many sub-structures can be built with as many thin green sheets 10, as necessary to build a final MLC laminate. As one can clearly see in FIG. 6, that the sub-structure 60, has one thick green sheet 20, and two thin green sheets 10, and this structure 60, has the rigidity for handling through screening and stacking. Furthermore, the dimensional stability of the screened features in thin green sheets 10, would be far better when screened as a sub-structure compared to screened as a free standing thin green sheet 10.

Figure 7:
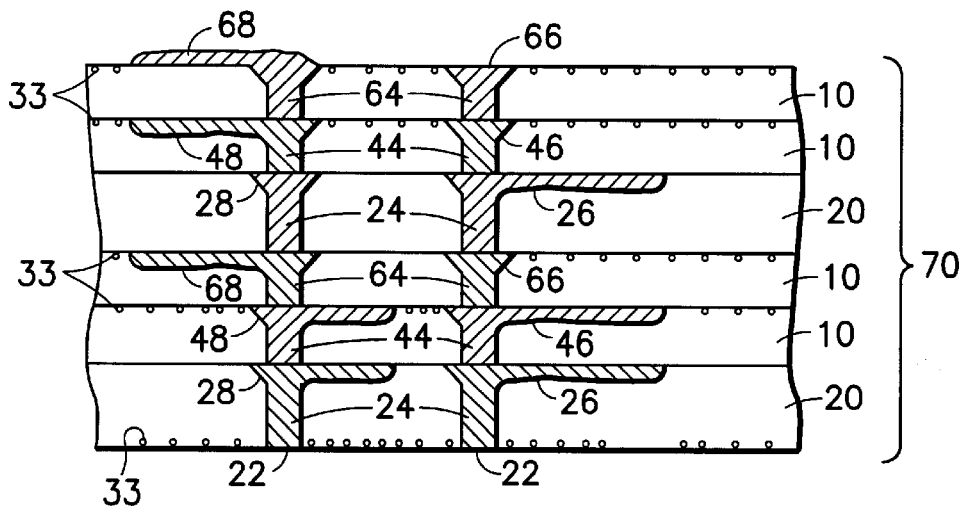
FIG. 7, illustrates another embodiment of this invention showing the structure of FIG. 6, being used to form a multilayer ceramic package.

FIG. 7, illustrates another embodiment of this invention showing the structure of FIG. 6, being used to form a multi-layer multi-density ceramic package 70. The package 70, could be formed by combining, for example, two sub-structures 60, resulting in the ceramic package 70, which comprises of at least one thick ceramic layer 20, and at least one thin ceramic green sheet layer 10. The two sub-structures 60, could be tacked/bonded and by using adhesion barrier material 33, to each other and they could also include several thin ceramic green sheets 10.

Each of the green sheets could have one or more electrically conductive features, such as, for example, cap, line, via, to name a few. These features could be made from at least one electrically conductive material.

The electrically conductive material used with this invention is preferably selected from a group comprising copper, molybdenum, nickel, tungsten, metal with glass frit, metal with glass grit, to name a few. However, the electrically conductive material used for the different layers and/or features could be the same material or it could be a different material.

The material for the green sheet 10 and/or 20, is preferably selected from a group comprising alumina, alumina with glass frit, borosilicate glass, aluminum nitride, ceramic, glass ceramic, to name a few.

The tacking and/or bonding could be done in a chemical environment, and wherein the chemical is preferably selected from a group comprising water, methanol, methyl-iso-butyl ketone, isopropyl alcohol, alumina, aluminum nitride, borosilicate, glass ceramic, copper, molybdenum, tungsten, nickel, to name a few.

The adhesion barrier material 33, is selected preferably from a group comprising fine particle, preferably submicron, magnesium silicate, alumino magnesium silicate ceramic, oxides of aluminum-magnesium-silicon, alumina, ceramics, to name a few.

Another advantage of this invention is the ability to punch, screen and stack very dense via and pattern in a package. As the via and pattern metal density increases in a green sheet (thick or thin) the feature radial error increases as well when one handles the green sheets as a free standing body. In such instances one could use the same or similar process as described and illustrated in FIGS. 1 through 7. Basically, the dense patterns are screened on the ceramic sub-structures rather than on the free standing ceramic green sheets. It has been found that the shrinkage and distortion is far smaller when sub-structures are screened than when the free standing green sheets are similarly processed. Furthermore, the sub-structures are built using the normal green sheet materials and the existing electrically conductive metal/composite pastes.

As stated earlier that the adhesion barrier 33, is applied as a dust on the lamination plates 31, basically to prevent the adhering of the green sheets 10 and/or 20, to the lamination plates 31. These particles 33, are subrnicron in size and they get coated on the exposed surface of the substrate during lamination, and embedded between the layers upon subsequent lamination. Upon sintering of the substrate, these inorganic adhesion barrier particles 33, become a part of the substrate micro-structure. Since the size of these dust particle 33, is extremely small and the quantity of these dust particles 33, is minimal, and the particle chemistry is preferably similar to one or more of the material of the green sheets 10 and/or 20, the adhesion barrier material 33, does not have an impact on any of the material sintering behavior or micro-structure.

It should also be appreciated that when the multi-density semiconductor substrate is separated from the surfaces of the laminating plate 31, it is done without any physical or electrical or mechanical damage to any of the feature of the multi-density substrate.

EXAMPLES

The following examples are intended to further illustrate the invention and are not intended to limit the scope of the invention in any manner.

Examples 1

Several samples of multi-layer ceramic sub-structures containing thin green sheets 10, of thicknesses varying from about 0.8 mils to about 6.0 mils, were built on thick ceramic green sheets 20, of various thicknesses ranging from about 6 mils to about 20 mils, using the method of this invention and which resulted in a structure 30, as shown in FIG. 3. The material for the ceramic green sheets 10 and 20, included alumina and glass ceramic. While the electrically conductive material included molybdenum, copper and other well-known composites. The sub-structures 30, were built at various pressures up to about 800 psi and with temperatures of up to about 90° C. and by using an adhesion barrier material 33. In all cases the sub-structures were measured for radial error. The radial errors were found to be less than about 1.2 mils, which showed a good layer to layer contact and alignment.

Examples 2

Several single thin ceramic green sheets 10, with thicknesses ranging from about 0.8 mils to about 3.0 mils were punched and screened as a free standing sheet 10. The material set for the green sheet 10, included alumina and glass ceramic and the electrically conductive material, such as, the metal paste, included molybdenum, copper and other composites. In all cases the free standing screened thin ceramic layers 10, were measured for radial errors. The measured radial errors in all cases was more than about 1.2 mils and ranged up to about 15.0 mils. It was also noticed that the free-standing screened thin layers 10, were all wrinkled and non-usable.

Example 3

Several samples of multi-layer ceramic sub-structures containing thin ceramic green sheets 10, of thicknesses varying from about 0.8 mils to about 6.0 mils were built with wiring density of about 3 mils on about 7 mil pitch using the method of this invention and the structures of FIG. 3, on thick green sheets 20, of various thicknesses ranging from about 6 mils to about 8 mils. The materials for the ceramic green sheets 10 and 20, included alumina and glass ceramic. The electrically conductive material included molybdenum, copper and composites. The sub-structures were built at various pressures up to about 800 psi and with temperatures up to about 90° C. and by using the adhesion barrier materials 33. In all cases the sub-structures were measured for radial error. It was found that the radial errors were less than about 1.2 mils, which meant a good layer to layer contact and alignment. Also the substructures separated from the plates 31, with no damage to ceramic body or the features.

Example 4

Several thin single green sheets 10, with thicknesses ranging from about 0.8 mils to about 6 mils, and wiring density of about 3 mil features on about 7 mil pitch were punched and screened as a free standing thin ceramic sheet. The material for the green sheet included alumina and glass ceramic and the material for the electrically conductive metal paste included molybdenum, copper and composites. In all cases the layers were measured for radial error. The measured radial errors in all cases were more than about 1.2 mils and ranged up to about 25 mils.

In most cases, in the above-mentioned examples, ceramic laminates that were made using the adhesion barriers, the inorganic powders had sintered and becomes a part of the ceramic substrate, and upon fuirther analysis of the sintered substrate using ESCA (Electron Spectroscopy for Chemical Analysis), electrical test, chip join and mechanical test, was found to be good.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A method of fabricating at least one multi-density semiconductor substrate comprising the steps of:
   (a) formiing at least one electrically conductive feature on at least one thick green sheet, wherein said at least one thick green sheet comprises at least one ceramic material;
   (b) providing at least one thin green sheet with at least one via hole, wherein said at least one thin green sheet comprises at least one ceramic material, and wherein said at least one thin green sheet is thinner than said at least one thick green sheet;
   (c) aligning and placing said at least one thin green sheet over said at least one thick green sheet, such that at least a portion of said electrically conductive feature is in contact with at least a portion of said via hole;
   (d) dusting lamination surfaces with at least one inorganic adhesion barrier powder which comprises a material selected from the group consisting of the at least one ceramic material of said thick green sheet and the at least one ceramic material of said thin green sheet;
   (e) tacking and bonding said at least one thin green sheet to said at least one thick green sheet using said lamination surfaces.

2. The method of claim 1, wherein said at least one via hole is filled with at least one first electrically conductive material.

3. The method of claim 2, wherein said at least one first electrically conductive material comprises a material selected from the group consisting of copper, molybdenum, nickel, tungsten, metal with glass frit and metal with glass grit.

4. The method of claim 2, wherein at least one second electrically conductive material is formed over said at least one thin green sheet, such that said at least one second electrically conductive material is in direct electrical contact with said at least one first electrically conductive material.

5. The method of claim 4, wherein said at least one second electrically conductive material comprises a material selected from the group consisting of copper, molybdenum, nickel, tungsten, metal with glass frit and metal with glass grit.

6. The method of claim 1, wherein the at least one ceramic material of said at least one thin green sheet is selected from the group consisting of alumina, alumina with glass fiit, borosilicate glass, aluminum nitride, ceramic and glass ceramic.

7. The method of claim 1, wherein the at least one ceramic material of said at least one thick green sheet is selected from the group consisting of alumina, alumina with glass frit, borosilicate glass, aluminum nitride, ceramic and glass ceramic.

8. The method of claim 1, wherein said at least one thin green sheet has a thickness between about 0.5 mils and about 6.0 mils.

9. The method of claim 1, wherein said at least one thick green sheet has a thickness of at least 6 mils.

10. The method of claim 1, wherein said tacking and bonding between said at least one thin green sheet and said at least one thick green sheet is done using means selected from the group consisting of thermal means, mechanical means and chemical means.

11. The method of claim 1, wherein during step (c) said aligning is done by at least one means selected from the group consisting of mechanical means and optical means, with correction for radial error or x-y and theta errors.

12. The method of claim 1, wherein said at least one adhesion barrier powder comprises a material selected from the group consisting of magnesium silicate, alumino magnesium silicate ceramic, oxides of aluminum-magnesium-silicon, alumina and ceramics.

13. The method of claim 1, wherein said at least one adhesion barrier powder comprises particles having an average particle size of less than about 5 microns.

14. The method of claim 1, wherein said at least one adhesion barrier has a thickness of less than about 20 mils.

15. The method of claim 1, wherein during step (e) said tacking and bonding is done at a tempe rature of less than about 90° C.

16. The method of claim 1, wherein during step (e) said tacking and bonding is done at a pressure of less than about 800 psi.

17. The method of claim 1, wherein during step (e) said tacking and bonding is done in a chemical environment, and wherein said chemical is selected from the group consisting of water, methanol, methyl-iso-butyl ketone, isopropyl alcohol, alumina, aluminum nitride, borosilicate, glass ceramic, copper, molybdenum, tungsten and nickel.

18. The method of claim 1, wherein said at least one electrically conductive feature is selected from the group consisting of cap, line and via.

19. The method of claim 18, wherein said at least one electrically conductive feature is formed from a material selected from the group consisting of copper, molybdenum, nickel, tungsten, metal with glass frit and metal with glass grit.

20. The method of claim 2, wherein said at least one via hole is filled with said at least one first electrically conductive material after said tacking and bonding.

21. The method of claim 2, wherein said at least one via hole is filled with said at least one first electrically conductive material before said tacking and bonding.

22. The method of claim 1, wherein said at least one adhesion barrier powder comprises particles having an average particle size of less than about 1 micron.

23. The method of claim 1, wherein said at least one adhesion barrier has a thickness of less than about 5 mils.

* * * * *